United States Patent [19]
Saida

[11] Patent Number: 5,607,795
[45] Date of Patent: Mar. 4, 1997

[54] BATTERY TERMINALS OF MINIATURE ELECTRONIC APPARATUS AND STRUCTURE FOR RETAINING THE SAME

[75] Inventor: Yoshihide Saida, Shizuoka, Japan

[73] Assignee: NEC Corporation, Tokyo, Japan

[21] Appl. No.: 592,231

[22] Filed: Jan. 26, 1996

[30] Foreign Application Priority Data

Jan. 26, 1995 [JP] Japan .................................. 7-010499

[51] Int. Cl.$^6$ ................................. H01M 2/10
[52] U.S. Cl. ........................... 429/100; 429/96; 429/198
[58] Field of Search ..................... 429/178, 100, 429/96, 1

[56] References Cited

FOREIGN PATENT DOCUMENTS 5-45019  11/1993  Japan .

Primary Examiner—John S. Maples
Attorney, Agent, or Firm—Sughrue, Mion, Zinn, Macpeak & Seas

[57] ABSTRACT

In a miniature electronic apparatus, a battery holding section has a first terminal and a second terminal for respectively contacting the positive electrode and negative electrode of a battery. The first and second terminals are each implemented by a resilient member. When the first and second terminals are fitted on the battery holding section, extensions and bent portions included in the terminals protrude below the holding section. When an upper case forming a part of the holding section is pressed against a printed circuit board, the bent portions are respectively brought into contact with positive and negative electrodes provided on the circuit board.

5 Claims, 9 Drawing Sheets

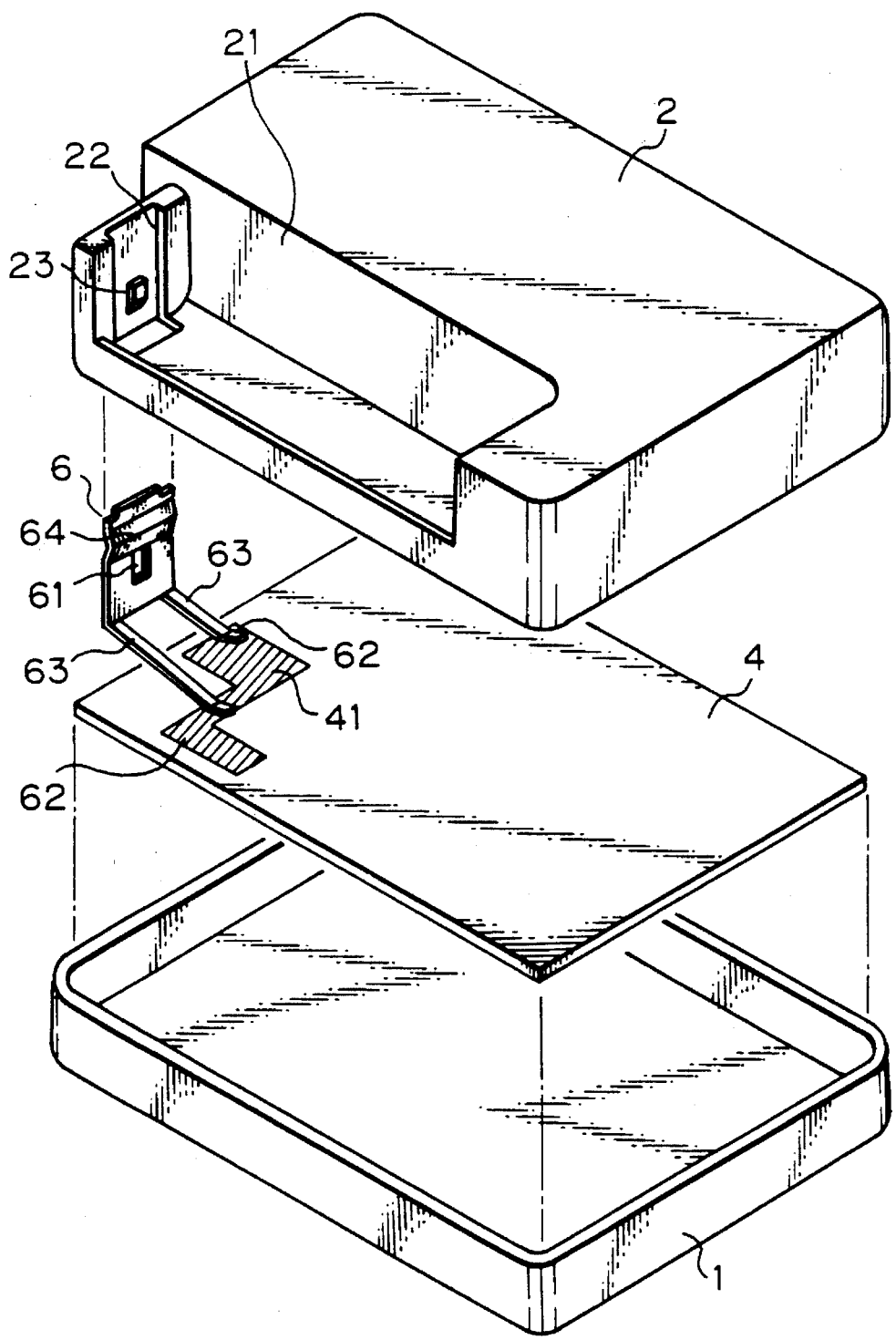

5,607,795

BATTERY TERMINALS OF MINIATURE ELECTRONIC APPARATUS AND STRUCTURE FOR RETAINING THE SAME

BACKGROUND OF THE INVENTION

The present invention relates to the structure of a battery holding section of a miniature electronic apparatus and, more particularly, to battery terminals provided in the battery holding section for electrically connecting the electrodes of a battery received in the section and electrodes provided on a printed circuit board.

Various kinds of miniature electronic apparatuses extensively used today are powered by batteries, and each has a battery holding section for receiving a battery. Power is fed from the battery received in the holding section to a printed circuit board accommodated in the apparatus. Battery terminals are mounted on the holding section in order to electrically connect the positive and negative electrodes of the battery to a positive and a negative electrode provided on the circuit board, respectively. It has been customary with the above kind of apparatus to connect the battery terminals to the electrodes of the circuit board by soldering, as taught in, e.g., Japanese Utility Model Laid-Open Publication No. 5-45019. However, the soldering scheme is time-consuming and increases the production cost of the apparatus having such a battery holding section. In addition, because the battery terminals and the electrodes of the circuit board are connected by soldering, it is difficult to separate them from each other for a recycling purpose.

SUMMARY OF THE INVENTION

It is therefore an object of the present invention to provide battery terminals of a miniature electronic apparatus and a structure for retaining them which make it unnecessary to solder the battery terminals to a printed circuit board and thereby simplify the assembly and reduce the production cost.

It is another object of the present invention to provide battery terminals of a miniature electronic apparatus which, as well as a printed circuit board, can be recycled, and a structure for retaining them.

In accordance with the present invention, a battery holding section of a miniature electronic apparatus having a printed circuit board loaded with electronic parts and an upper and a lower case accommodating the printed circuit board, and a structure for retaining them have a battery holding chamber formed in the upper case and for receiving the battery. A first terminal includes a resilient deformable portion and is retained by one end of the battery holding section. The resilient deformable portion has a portion protruding below the battery holding section and contacting a first or positive electrode located at a first predetermined position on the printed circuit board. A second terminal includes a resilient deformable portion and is retained by the other end of the battery holding section. The resilient deformable portion of the second terminal has a portion protruding below the battery holding section and contacting a second or negative electrode located at a second predetermined position on the printed circuit board. A first recess is formed in the one end of the battery holding section, for receiving and retaining the first terminal. A projection is also formed in the one end of the battery holding section, for preventing the first terminal received in the first recess from slipping out. A second recess is formed in the other end of the battery holding section, for receiving and retaining the second terminal.

BRIEF DESCRIPTION OF THE DRAWINGS

The above and other objects, features and advantages of the present invention will become more apparent from the following detailed description taken with the accompanying drawings in which:

FIG. 3 is an exploded perspective view showing an alternative embodiment of the present invention;

DESCRIPTION OF THE PREFERRED EMBODIMENTS

Figure 9A:
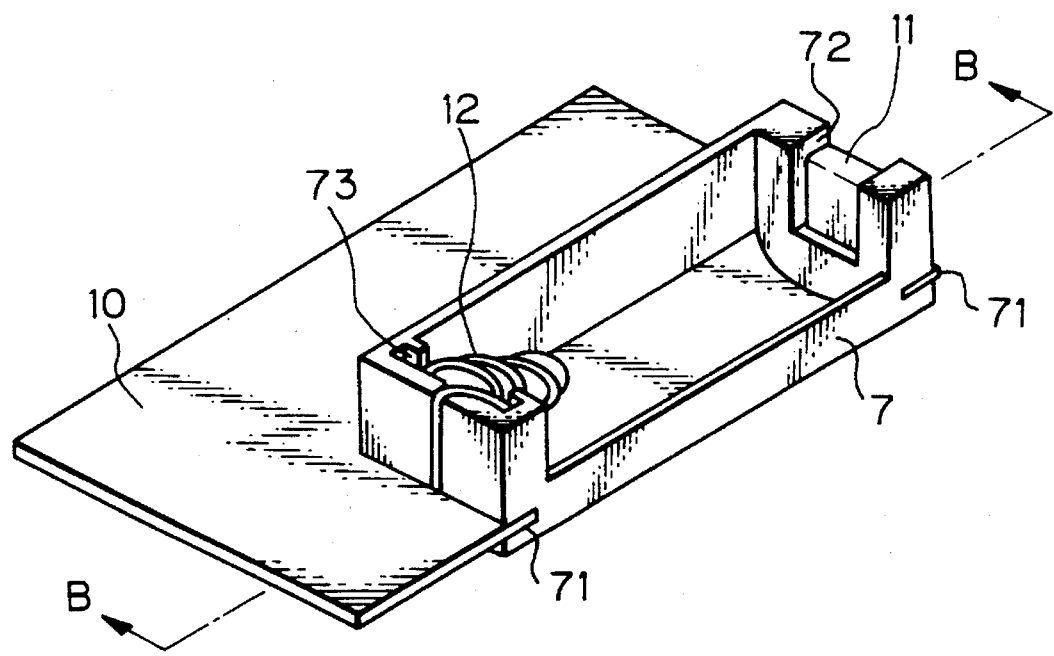
FIG. 9A is an exploded perspective view showing a conventional battery holding section included in a miniature electronic apparatus.
Figure 9B:
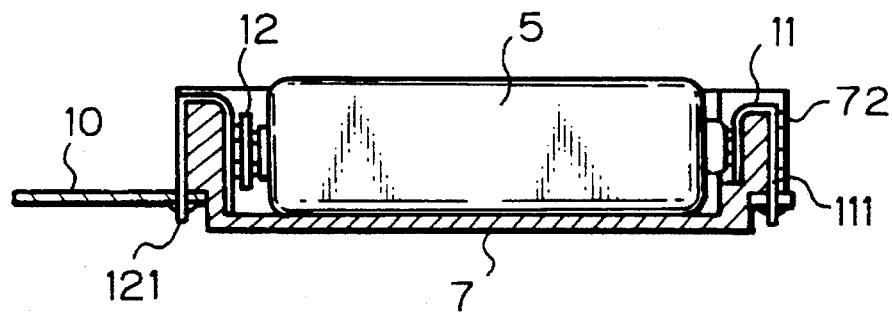
FIG. 9B is a section along line B—B of FIG. 9A.

To better understand the present invention, a brief reference will be made to a conventional battery holding section included in a miniature electronic apparatus and of the kind taught in the previously mentioned Utility Model Laid-Open Publication No. 5-45019. As shown in FIG. 9A, the conventional battery holding section has a case 7 for receiving a battery 5. A terminal plate 11 is mounted on one end of the case 7 while a conical coil spring 12 is mounted on the other end of the case 7. Grooves 71 are formed in the outer periphery of the opposite ends of the case 7. A printed circuit board 10 is notched in the form of letter U and joined with the case 7 by being received in the grooves 71. As shown in FIG. 9B, the terminal plate 11 is implemented as a flat member bent in the form of letter U and includes a lead portion 111. A hole 72 is formed in the end of the case 7 where the terminal plate 11 is positioned. The lead portion 111 is inserted in the hole 72 and soldered to a positive electrode provided on the circuit board 10. The coil spring 12 is inserted in a hole 73 formed in the other end of the case 7. The end 121 of the coil spring 12 is soldered to a negative terminal also provided on the circuit board 10.

The conventional arrangement described above has some problems, as follows. The terminal plate 11 is inserted into the hole 72 of the case 72 and then has its lead portion 111 soldered to the positive terminal of the circuit board 10. Likewise, the coil spring 12 is inserted into the hole 73 of the case 72 and then soldered to the negative terminal of the circuit board 10. This kind of procedure is time-consuming and increases the production cost of the apparatus. In addition, because the terminal plate 11 and coil spring 12 soldered to the circuit board 10 cannot be easily separated from the circuit board 10, they cannot be recycled.

Figure 1:
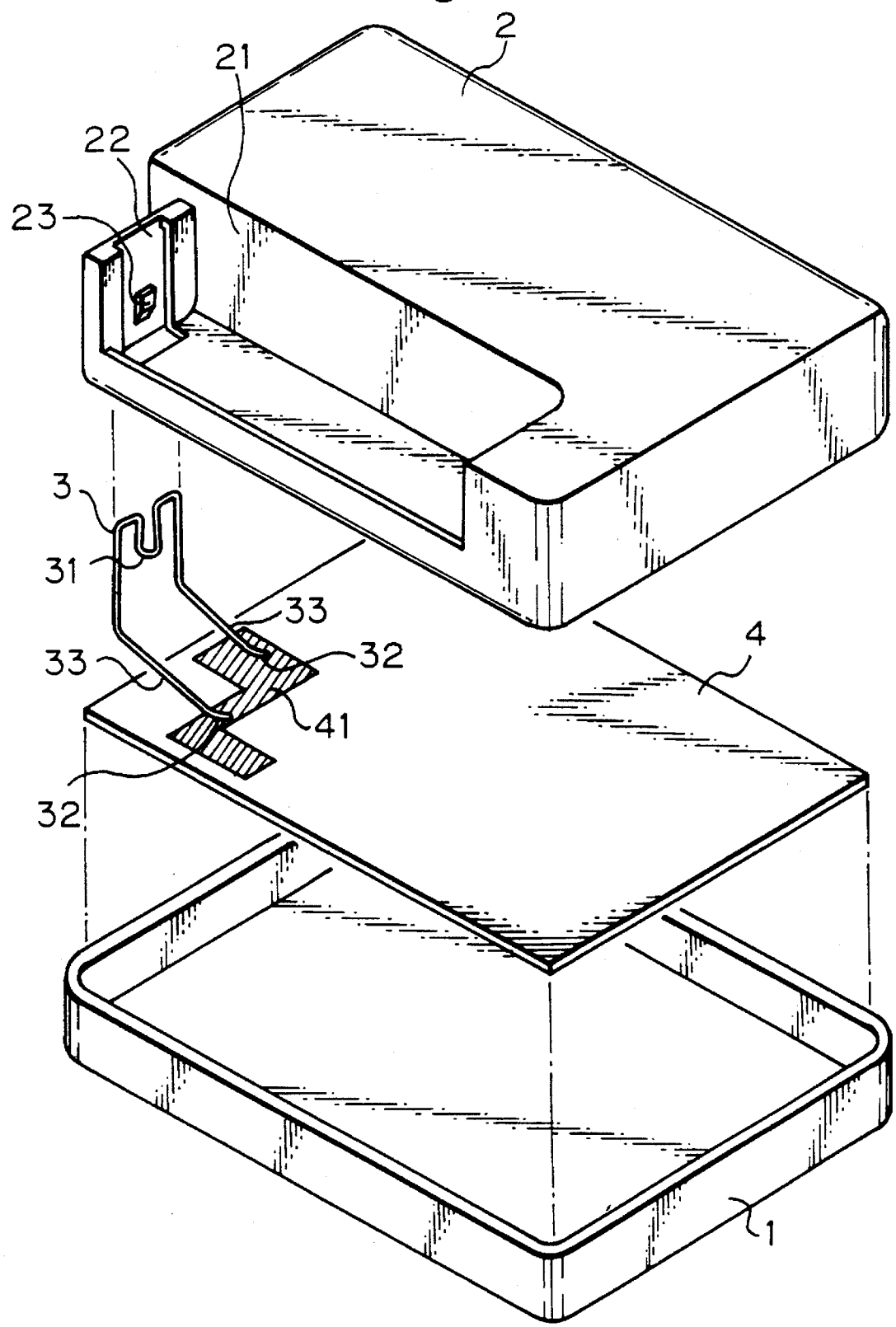
FIG. 1 is an exploded perspective view showing battery terminals of a miniature electronic apparatus and a structure for retaining them embodying the present invention.

Referring to FIG. 1, a terminal for a battery and a battery holding structure embodying the present invention are shown. As shown, a miniature electronic apparatus has a battery holding section made up of an upper case 2 and a lower case 1 which are made of plastics. The upper case 2 has a battery chamber 21 for receiving a battery, not shown. One end wall of the chamber 21 is formed with a first recess 22 and a projection 23 which cooperate to hold a first terminal 3. The first terminal 3 is to be connected to the positive electrode of the battery. The first terminal 3 has a generally M-shaped body portion including an intermediate portion 31. The terminal 3 is inserted into the first recess 22 from below the upper case 2. Then, the intermediate portion 31 of the terminal 3 gets over the projection 23 while deforming due to its resiliency. When the intermediate portion 31 abuts against or rests on the top of the projection 23, the terminal 3 is locked in position and held by the case 2.

Specifically, the first terminal 3 is implemented by a wire used for coil springs having a circular cross-section. The wire is bent in a generally M configuration and has extensions 33 extending from the ends of the legs of "M". The extensions 33, each having a predetermined particular length, and the legs of "M" make a predetermined angle greater than 90 degrees relative to the legs. The extensions 33 each has a bent end 32 for contacting a first electrode or positive electrode provided on a printed circuit board 4. The upper case 2 presses the circuit board 4 downward so as to insure the electrical conduction between the bent ends 32 and the first electrode 41.

Figure 2A:
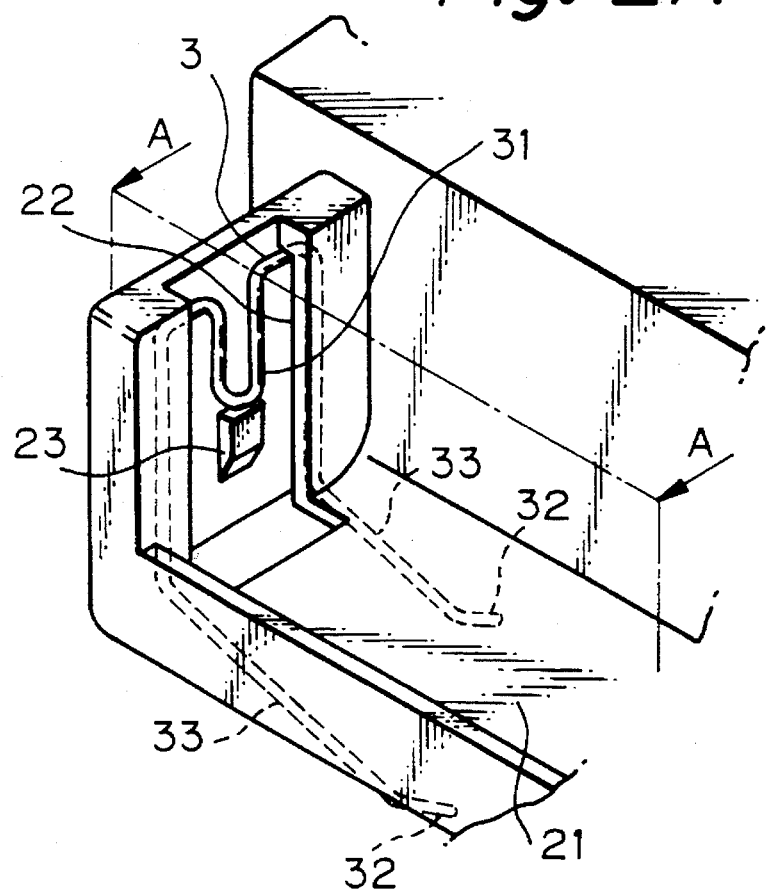
FIG. 2A is a fragmentary perspective view showing a first battery terminal and a battery holding section included in the apparatus of FIG. 1.
Figure 2B:
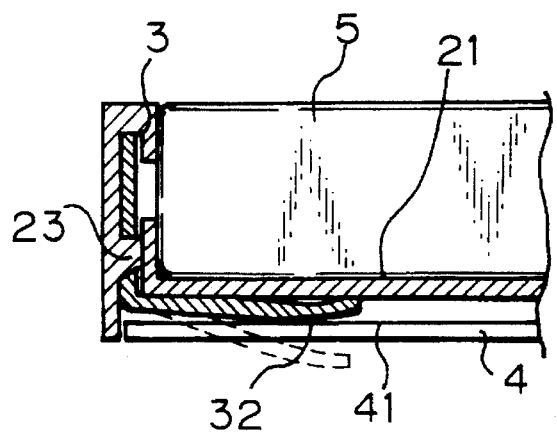
FIG. 2B is a fragmentary section showing a battery received in the battery holding section of FIG. 2A.

More specifically, as shown in FIG. 2A, the first terminal 3 has its M-shaped portion retained in the first groove 22 and has the intermediate portion 31 held in abutment against the projection 23. In this condition, the terminal 3 is prevented from slipping out of the recess 22, i.e., battery chamber 21. As shown in FIG. 2B, when the upper case 2 holding a battery 5 in its chamber 21 is pressed against the circuit board 4, the extensions 33 and bent ends 32 of the terminal 3 are resiliently deformed. As a result, the bent ends 32 contact the first electrode 41 of the circuit board 4. This sets up electrical conduction between the battery 5 and the electrode 41 via the terminal 3.

It is noteworthy that each of the bent ends 32 of the terminal 3 has a smooth curvature and thereby protects the electrode 41 from corrosion ascribable to scratches. The corrosion would deteriorate the electrical conduction.

FIG. 3 shows an alternative embodiment of the present invention. As shown, a miniature electronic apparatus has a battery holding section also made up of the upper case 2 and lower case 1 which are made of plastics. The upper case 2 has the battery chamber 21 for receiving a battery, not shown. One end wall of the chamber 21 is formed with the first recess 22 and projection 23 which cooperate to hold a first terminal 6. The first terminal 6 is inserted into the first recess 22 from below the upper case 2. Then, the portion of the terminal 6 around a hole 61 is resiliently deformed and engaged with the projection 23. As a result, the terminal 6 is locked in position and held by the end of the case 2.

Specifically, the first terminal 6 is implemented by a sheet used for springs and includes a ridge 64. The ridge 64 insures the contact of the terminal 6 with the positive electrode of the battery. Extensions 63 extend from the opposite lower ends of the body portion of the terminal 6, and each has a predetermined particular length. The extensions 63 and the body portion of the terminal 6 make a predetermined angle greater than 90 degrees therebetween. The extensions 63 each has a bent end 62. When the upper case 2 presses the bent ends 62 against the first electrode 41 of the circuit board 4, the bent ends 62 are surely brought into contact with the electrode 41.

Figure 4A:
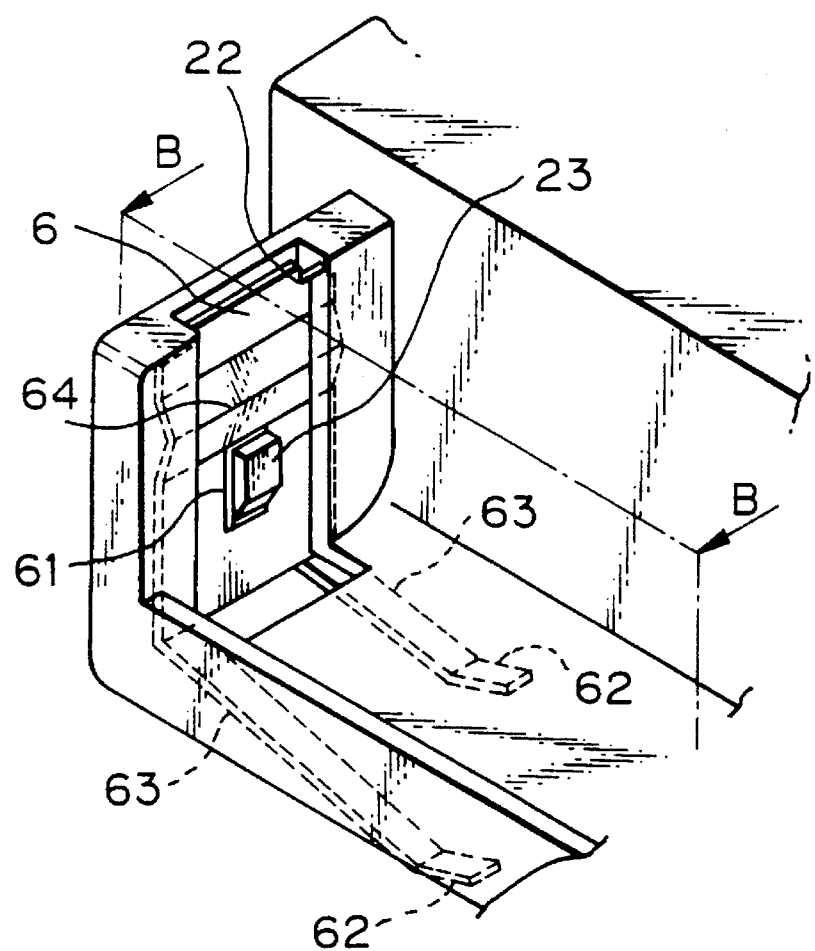
FIG. 4A is a fragmentary perspective view showing a battery terminal and a battery holding section included in the embodiment of FIG. 3.
Figure 4B:
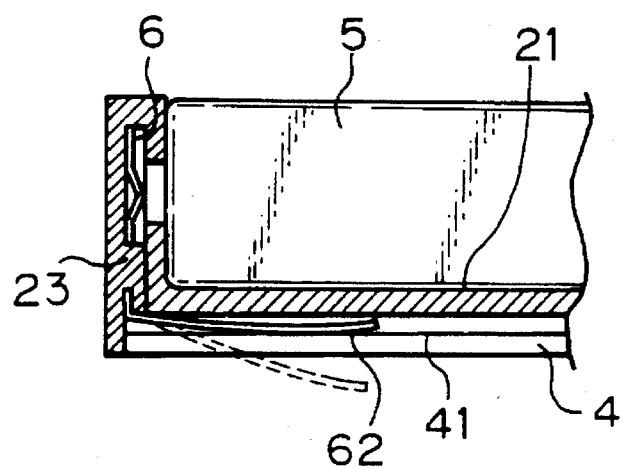
FIG. 4B is a fragmentary section showing a battery received in the battery holding section of FIG. 4A.

More specifically, as shown in FIG. 4A, the first terminal 6 is received in the first recess 22 formed in one end wall of the battery chamber 21. The terminal 6 is locked in position by the ridge 64. Further, the hole 61 mates with the projection 61. In this condition, the terminal 6 is prevented from slipping out of the recess 22. As shown in FIG. 4B, when the upper case 22 is pressed against the circuit board 4, the extensions 63 and bent ends 62 of the terminal 6 are resiliently deformed. As a result, the bent portions 62 are brought into contact with the electrode 41 of the circuit board 4. Hence, electrical conduction is set up between the battery 5 and the electrode 41 via the terminal 3.

Again, the bent ends 62 of the terminal 6 each has a smooth curvature and thereby protects the electrode 41 from corrosion ascribable to scratches.

Figure 5:
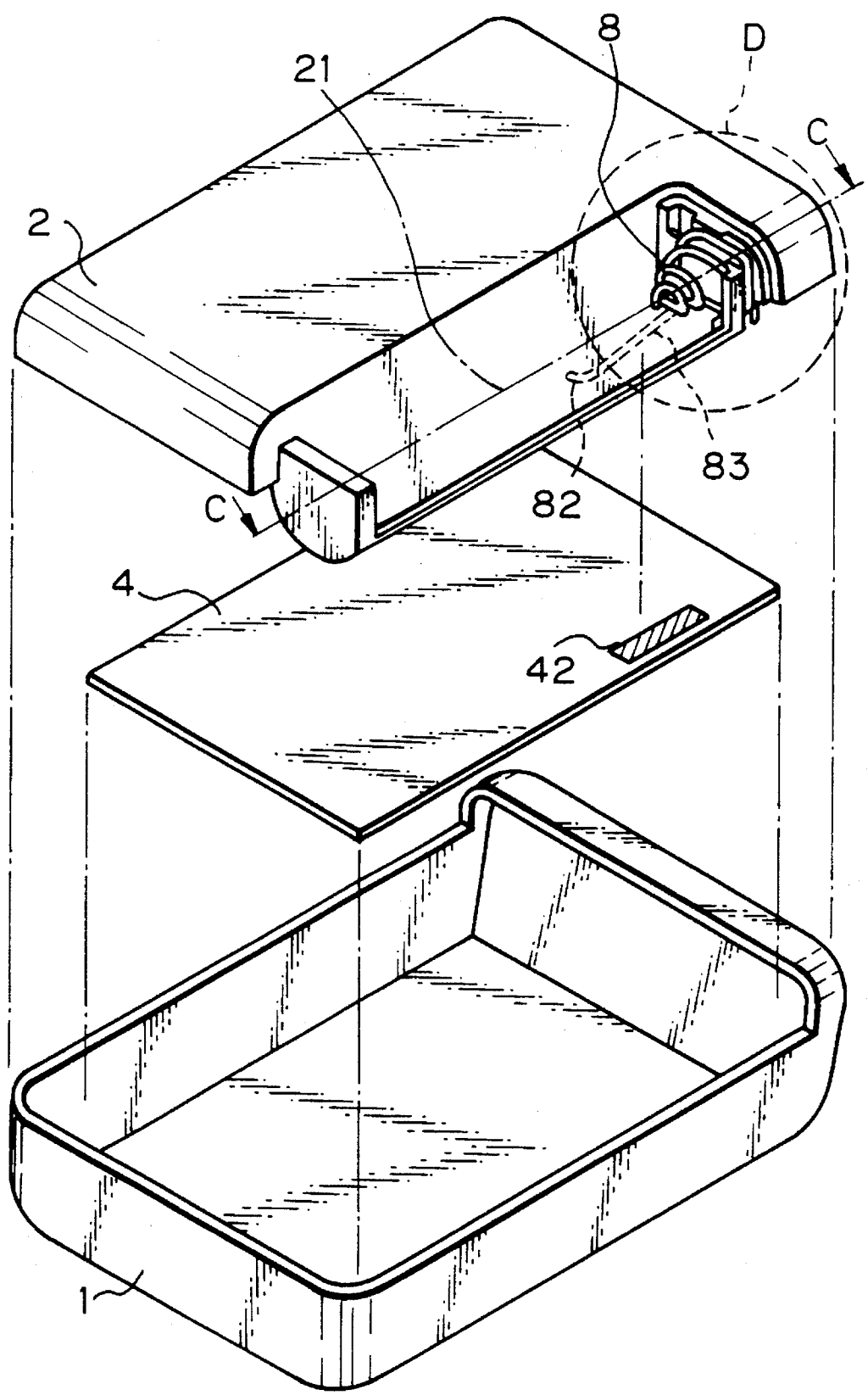
FIG. 5 is an exploded perspective view showing another alternative embodiment of the present invention.

FIG. 5 shows another alternative embodiment of the present invention. As shown, a miniature electronic apparatus has the upper case 2 and lower case 1 which are made of plastics. In the upper case 2, one end wall of the battery chamber 21 retains a second terminal 8 for the battery, not shown. The second terminal or conical coil spring 8 is implemented by for springs having a circular cross-section. The coil spring 8 includes an extension 83 extending from the bottom of the cone at a predetermined angle larger than 90 degrees over a predetermined distance relative to the bottom of the cone. The extension 83 has a bent end 82 bent at a predetermined angle. The bent end 82 contacts a second electrode 42 provided on the circuit board 4, so that electrical connection is set up between the second terminal 8 and the second electrode 42.

Figure 6A:
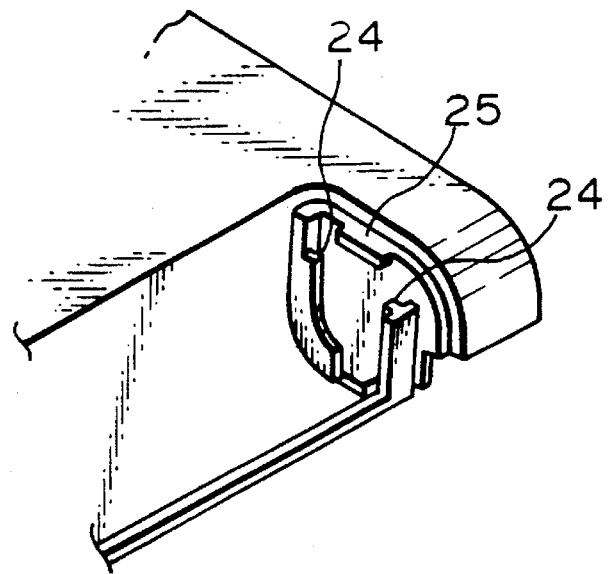
FIG. 6A is a fragmentary perspective view showing a battery holding section included in the embodiment of FIG. 5 and configured to retain a second battery terminal.
Figure 6B:
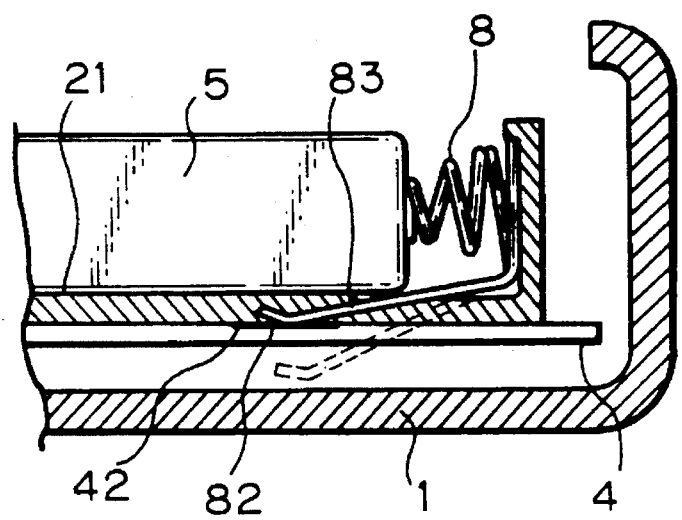
FIG. 6B is a fragmentary section showing a battery received in the battery holding section of FIG. 6A.

Specifically, as shown in FIG. 6A, the upper case 2 is formed with a second recess 24 and a projection or rib 25. The second terminal or conical coil spring 8 has its largest diameter portion or bottom of the cone held by the recess 24 and rib 25. As shown in FIG. 6B, when the upper case 2 is pressed against the circuit board 4, the extension 83 extending from the largest diameter portion of the coil spring 8 and the bent end 82 thereof are elastically deformed. As a result, the bent end 82 contacts the second terminal 42 of the circuit board 4. This sets up electrical connection between the battery 5 and the electrode 42 via the terminal 8. The bent end 82 of the terminal 8 has a smooth curvature and thereby protects the electrode 42 from corrosion ascribable to scratches.

Figure 7:
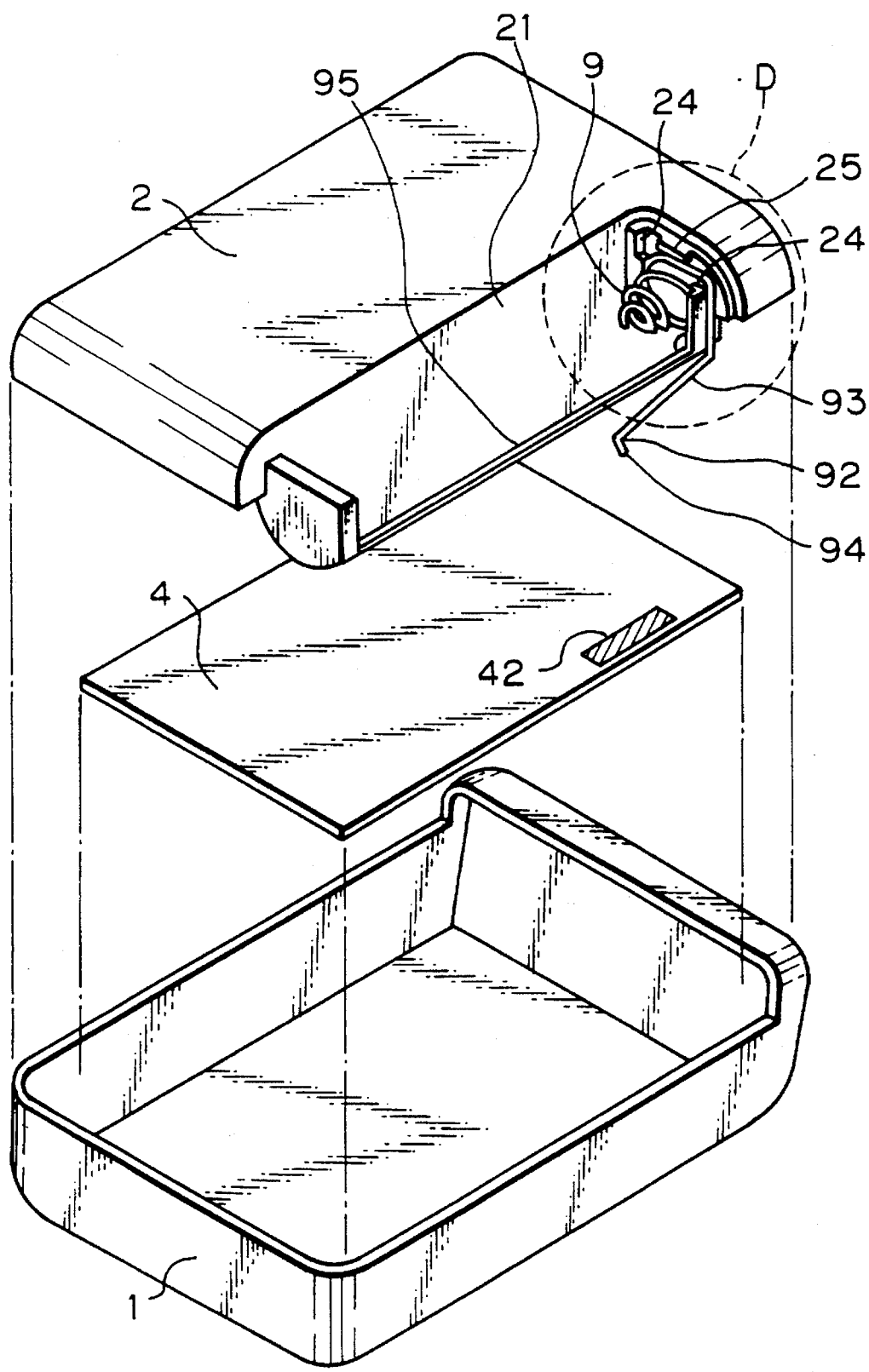
FIG. 7 is an exploded perspective view showing a further alternative embodiment of the present invention.

FIG. 7 shows a further alternative embodiment of the present invention. As shown, in the upper case 2, one end wall of the battery chamber 21 retains a second terminal 9 for a battery, not shown. The second terminal or conical coil spring 9 is implemented by a wire for springs having a circular cross-section. The coil spring 8 includes an extension 93 extending from the largest diameter portion or bottom of the conical coil spring 9, but at the outside of the chamber 21. The extension 93 is inclined by an angle greater than 90 degrees relative to the bottom of the cone of the coil spring 8 and has a predetermined length. The extension 93 has a bent end 92 bent by an angle smaller than 90 degrees relative to the center line of the cone of the coil spring 8. The bent end 92 contacts the second electrode 42 provided on the circuit board 4, so that electrical connection is set up between the second terminal 9 and the second electrode 42.

Figure 8:
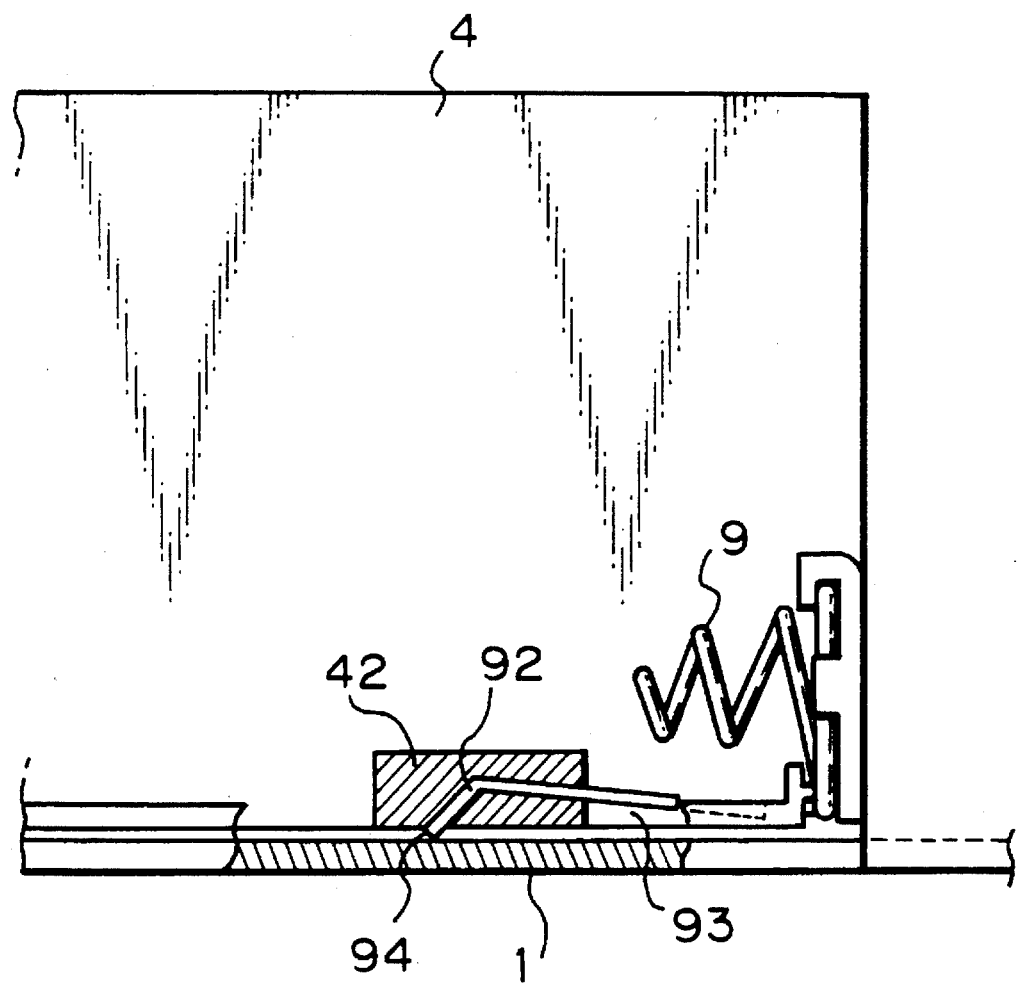
FIG. 8 is a plan view representative of the engagement of a second battery terminal included in the embodiment of FIG. 7 and a lower case.

Specifically, as indicated by a dashed circle D in FIG. 7, the upper case 2 is formed with the second recess 24 and the projection or rib 25. The second terminal or conical coil spring 9 has its largest diameter portion or bottom of the cone held by the recess 24 and rib 25. The extension 93 of the terminal 9 protrudes to below the battery chamber 21 while the tip 94 of its bent end 92 protrudes to the outside of the side wall 95 of the chamber 21. When the upper case 2 presses the circuit board 4, the extension 93 adjoins the electrode 42 of the circuit board 4. As shown in FIG. 8, when the upper case 2 and lower case 1 are joined together, the tip 94 of the bent end 92 of the terminal 9 abuts against the inner periphery of the lower case 1. This causes the extension 93 of the terminal 9 to resiliently deform and thereby allows the bent portion 92 to surely contact the electrode 42 without missing it.

As stated above, the bent portion 92 is positioned against the inner periphery of the lower case 1. Hence, despite that the second terminal 9 is implemented by a single wire, the bent portion 92 of the terminal 9 is surely brought into electrical connection with the negative electrode of the circuit board 4.

In summary, battery terminals included in a miniature electronic apparatus and a terminal retaining structure embodying the present invention have various unprecedented advantages, as enumerated below.

(1) A first terminal to contact the positive electrode of a battery and a second terminal to contact the negative electrode of the battery are each implemented by a resilient member. When the first and second terminals are fitted on a battery holding section included in the apparatus, extensions and bent portions included in the terminals protrude to below the holding section. When an upper case forming a part of the holding section is pressed against a printed circuit board, the bent portions are respectively brought into contact with positive and negative electrodes provided on the circuit board. Hence, the first and second terminals do not have to be soldered to the circuit board. This saves the conventional soldering time and thereby reduces the production cost.

(2) Because the terminals are fitted on the upper case, they can be easily separated from the circuit board only if the upper case is separated from a lower case forming the other part of the holding section. Therefore, when electronic circuitry mounted on the circuit board fails, the circuit board can be replaced with ease. In addition, it is not necessary to again attach the terminals after the replacement. Consequently, the time and cost necessary for maintenance are reduced.

(3) The terminals (metal), cases (plastics) and circuit board can be easily separated from each other and recycled independently of each other. This is desirable from the environmental standpoint.

(4) The ends of the terminals contacting electrodes provided on the circuit board are smoothly bent. Hence, when the upper case presses the terminals, the bent ends are prevented from scratching or otherwise damaging the circuit board. This prevents defective conduction due to the corrosion of the electrodes.

(5) The terminals are inexpensive because they are implemented by an ordinary wire used for coil springs.

(6) Because the first terminal contacts the positive electrode of the circuit board at two points, reliable conduction between them is enhanced.

Various modifications will become possible for those skilled in the art after receiving the teachings of the present disclosure without departing from the scope thereof.

What is claimed is:

1. A battery holding section of a miniature electronic apparatus having a printed circuit board loaded with electronic parts and an upper and a lower case accommodating the printed circuit board comprising:

a battery holding chamber formed in said upper case for receiving a battery;

a first terminal including a resilient deformable portion, said first terminal being retained by one end of said battery holding chamber, wherein said resilient deformable portion has a portion protruding below said battery holding chamber and contacting a first electrode located at a first position on the printed circuit board;

a second terminal including a resilient deformable portion, said second terminal being retained by the other end of said battery holding chamber opposite to said one end, wherein said resilient deformable portion of said second terminal has a portion protruding below said battery holding chamber and contacting a second electrode located at a second position on the printed circuit board;

a first recess formed in said one end of said battery holding chamber for receiving and retaining said first terminal;

a projection formed in said one end of said battery holding chamber for preventing said first terminal received in said first recess from slipping out; and a second recess formed in said other end of said battery holding chamber for receiving and retaining said second terminal.

2. A battery holding section as claimed in claim 1, wherein said first terminal comprises a singe wire, said wire comprising:

an M-shaped body portion for contacting a first battery electrode at an intermediate portion thereof;

extensions respectively extending from lower ends of legs of said M-shaped body portion at an angle greater than 90 degrees relative to said body portion over a distance; and bent portions respectively extending upward from said extensions at an angle, wherein after said body portion has been inserted into said first recess from below said upper case until an intermediate portion of said body portion has rested on a top of said projection, said extensions and said bent portions are pressed downward by a bottom of said upper case, thereby establishing electrical connection between said bent portions and the first electrode of the printed circuit board.

3. A battery holding section as claimed in claim 1, wherein said first terminal comprises a single sheet, said first terminal further comprising:

a body portion including a ridge for contacting a first battery electrode, and a hole to mate with said projection for preventing said first terminal from slipping off said battery holding section;

extensions respectively extending from two points of a lower end of said body portion at an angle greater than 90 degrees relative to said body portion over a distance; and bent portions respectively extending upward from said extensions at an angle, wherein after said body portion has been inserted into said first recess from below said upper case until said hole has mated with said projection, said extensions and said bent portions are pressed downward by a bottom of said upper case, thereby establishing electrical connection between said bent portions and the first electrode of the printed circuit board.

4. A battery holding section as claimed in claim 1, wherein said second terminal comprises a single wire, said wire further comprising:

a conical coil portion for contacting a battery electrode at an apex thereof;

an extension extending from a bottom of said conical coil portion at an angle greater than 90 degrees relative to said bottom of said conical coil portion over a distance; and a bent portion extending upward from said extension at an angle, wherein after the bottom of said conical coil portion has been inserted into said second recess, said extension and said bent portion protruding below said battery holding chamber are pressed by a bottom of said upper case, thereby establishing electrical connection between said bent portion and the second electrode of the printed circuit board.

5. A battery holding section as claimed in claim 1, wherein said second terminal comprises a single wire, said wire further comprising:

a conical coil portion for contacting a battery electrode at an apex thereof;

an extension extending from a bottom of said conical coil portion at an angle greater than 90 degrees relative to said bottom of said conical coil portion over a distance, and extending to an outside of said battery holding chamber; and a bent portion extending downward from said extension at an angle, said bent portion having a tip which protrudes to the outside of a side wall of said battery holding chamber, wherein after the bottom of said conical coil portion has been inserted into said second recess, said bent portion protruding below said battery holding chamber are pressed by an inner periphery of said lower case, thereby establishing electrical connection between said bent portion and the second electrode of the printed circuit board.

* * * * *